US010520530B2

(12) United States Patent
Michna et al.

(10) Patent No.: US 10,520,530 B2
(45) Date of Patent: Dec. 31, 2019

(54) POWER SENSE OUTPUT

(71) Applicant: HEWLETT PACKARD ENTERPRISE DEVELOPMENT LP, Houston, TX (US)

(72) Inventors: Vincent W. Michna, Houston, TX (US); Peter Hansen, Houston, TX (US); Julie Victoria Tan, Houston, TX (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 160 days.

(21) Appl. No.: 15/661,612

(22) Filed: Jul. 27, 2017

(65) Prior Publication Data

US 2019/0033349 A1    Jan. 31, 2019

(51) Int. Cl.
    *G06F 11/30*    (2006.01)
    *G01R 19/25*    (2006.01)
(52) U.S. Cl.
    CPC .................... *G01R 19/25* (2013.01)
(58) Field of Classification Search
    CPC .................................................... G01R 19/25
    See application file for complete search history.

(56) References Cited

U.S. PATENT DOCUMENTS

| 6,118,270 | A | 9/2000 | Singer et al. |
| 8,564,927 | B2 | 10/2013 | Albertson |
| 9,195,252 | B1* | 11/2015 | Tanase ............... G05F 3/262 |
| 9,671,438 | B2* | 6/2017 | Zhang .............. G01R 19/0092 |
| 2005/0247576 | A1* | 11/2005 | Tom .................. G01N 27/42 |
| | | | 205/793.5 |
| 2011/0010118 | A1 | 1/2011 | Gaarder et al. |
| 2012/0123711 | A1 | 5/2012 | Fausak et al. |

OTHER PUBLICATIONS

David Wyban, "Techniques for Simplifying Pulsed Measurements: Part 1," Solid State Technology, 2015, pp. 1-15 [online], Retrieved from the Internet on Mar. 7, 2017 at URL: <http://electroiq.com/blog/2015/02/techniques-for-simplifying-pulsed-measurements-part-1/>.

* cited by examiner

*Primary Examiner* — Phuong Huynh
(74) *Attorney, Agent, or Firm* — Hewlett Packard Enterprise Patent Department

(57) ABSTRACT

Examples disclosed herein relate to determining a power sense output based on a current sense line and a voltage sense line. A first stage circuit has a first voltage input of the current sense line of a server. The first stage circuit also has a feedback voltage input based on an output voltage of the first stage circuit and a variable resistance value based on the voltage sense line of the server. A second stage circuit is used to buffer the first output voltage to yield a second output voltage. A third stage circuit yields a power sense output based on a difference between the second output voltage and the first voltage input.

20 Claims, 3 Drawing Sheets

POWER SENSE OUTPUT

BACKGROUND

A data center is a facility used to house computer networks, computer systems, and associated components, such as telecommunications and storage systems. It may include redundant or backup power supplies, redundant data communications connections, environmental controls (e.g., air conditioning, fire suppression, etc.), and security devices. Equipment in a data center may be in the form of servers mounted in rack cabinets. Each rack mounted server can include one or more power supplies. A data center may also include blade systems and/or cartridge systems that include servers mounted inside of an enclosure or chassis.

BRIEF DESCRIPTION OF THE DRAWINGS

The following detailed description references the drawings, wherein.

Figure 2:
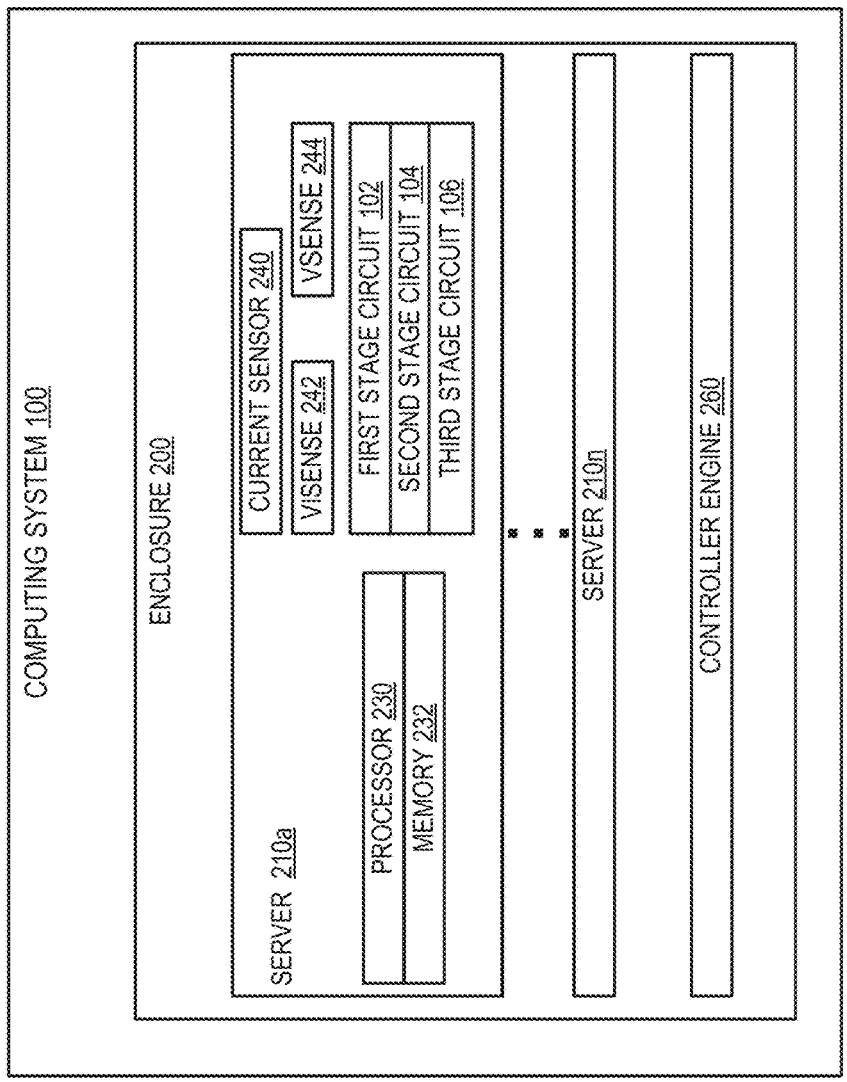
FIGS. 1 and 2 are block diagrams of computing systems with a three stage circuit to generate a power sense output, according to various examples.

Throughout the drawings, identical reference numbers may designate similar, but not necessarily identical, elements. An index number "N" appended to some of the reference numerals may be understood to merely denote plurality and may not necessarily represent the same quantity for each reference numeral having such an index number "N". Additionally, use herein of a reference numeral without an index number, where such reference numeral is referred to elsewhere with an index number, may be a general reference to the corresponding plural elements, collectively or individually. In another example, an index number of "I," "M," etc. can be used in place of index number N.

DETAILED DESCRIPTION

Contemporary computer hardware uses non trivial amounts of electricity. Special circuitry and firmware can be included in a computer product to help measure and control power usage. These power control features require the ability to accurately measure the power consumption of a compute node. Usage can be measured in total power (e.g., wattage).

In making the measurement, two readings can be taken by firmware from the system, the total current, measured in amperage, and a reference voltage value—which can vary under higher loads. Both values can be measured using analog circuitry in the server. However, each analog line is sampled repeatedly and averaged to increase accuracy (at the expense of time).

Accordingly, various examples described herein relate to a circuit that combines the reference voltage and current analog readings into a single meaningful analog test point, a power sense (p-sense) line. The p-sense line can be sampled by firmware to quickly establish total wattage of the compute or any other entity in an Information Technology system.

With the approaches described herein, the time to repeatedly sample the two analog lines to determine current and voltage for the wattage computation is reduced since only a single analog line is now measured. Current and voltage measurements are done in a simultaneous and concurrent fashion—significantly increasing accuracy of the measurement compared to separately sampling analog current and voltage lines.

In some designs, a source for input voltage is not available to management firmware for measurement due to restrictions in a connector or other limitations to shared voltage regulator module (VRM) designs. If the wattage of the node is being measured by a shared infrastructure chassis controller, then pin count can be reduced on a connector of a server since no voltage reference from the server would be required. This can reduce the overall cost of manufacturing for both the server and chassis.

Figure 1:
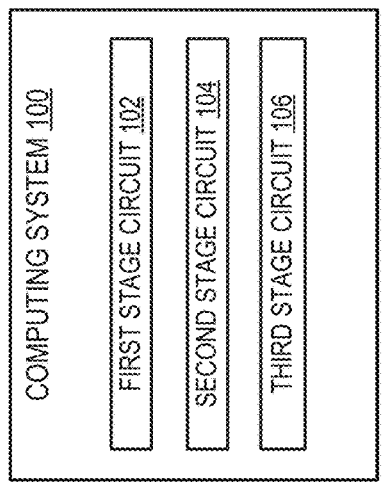

FIGS. 1 and 2 are block diagrams of computing systems with a three stage circuit to generate a power sense output, according to various examples. In some examples, computing system 100 may be server such as a blade server or server cartridge in a larger system. In other examples, computing system 100 may include an enclosure 200 that includes one or multiple servers 210a-210n.

Each server 210a-210n may include one or multiple processors 230, memory, storage, and/or network interfaces. For example, each server 210 can include a processor 230 that is adapted to execute stored instructions. The processor 230 can be a single core processor, multi-core processor, a computing cluster, etc. Each server 210 can connect to a chassis backplane of the enclosure 200 through a bus. The bus may be a series of interconnects. In some examples, interconnects may be connected from the servers 210 to the enclosure via one or multiple connectors. In some examples, some components may be communicatively coupled to the server (e.g., storage may be external to one or more of the servers).

A current sensor 240 can be used to determine a current sense line (i-sense). The i-sense line can be represented via a voltage value Visense 242. The current sensor 240 can be implemented using a current sensing circuit, for example, presented by an electric fuse used to protect a component, a shunt, a metal-oxide-semiconductor field-effect transistor (MOSFET), integrated circuits, combinations thereof, etc. In some examples, a range of values of voltage values of Visense 242 can map to current values. As used herein, a current sense line is an analog representation of the current used by a server. The current sense line can be a voltage representation.

Vsense 244 can be a connected to an input voltage to a server 210. In one example, the input voltage may be 12V, 3.3V, 5V, etc. Moreover, the Vsense 244 line may be a voltage that is based on the input voltage but scaled down (e.g., via a voltage divider circuit). Similar to Visense 242, a range of voltage values of the Vsense 244 line can map to corresponding input voltages. As used herein, a voltage sense line is an analog representation of a voltage of the server (e.g., a 12 volt line). As noted, the voltage sense line may be scaled (or have particular characteristics). In some examples, the Vsense line 244 can be linked to a Voltage Regulator Module (VRM), an external power source, a common power backplane, or the like.

In one example, the first stage circuit 102 can have 2 inputs. A first input includes the Visense 242 line can be used as an input to the first stage circuit 102. The second input can include a feedback voltage based on an output voltage of the first stage circuit 102 a variable resistance value as further described in FIG. 3. The Vsense 244 line can be used to control a voltage controlled resistor that controls the variable resistance value. The feedback voltage can also be based on a known resistance value as further explained in FIG. 3. For example, the resistive value can be inversely proportional to the Vsense 244 line.

The second stage circuit 104 can be used to buffer the output voltage of the first stage circuit 102. The second stage circuit 104 can have an input of the output of the first stage circuit 102 and a feedback input that is the output of the second stage circuit 104 as further described in FIG. 3.

Figure 3:
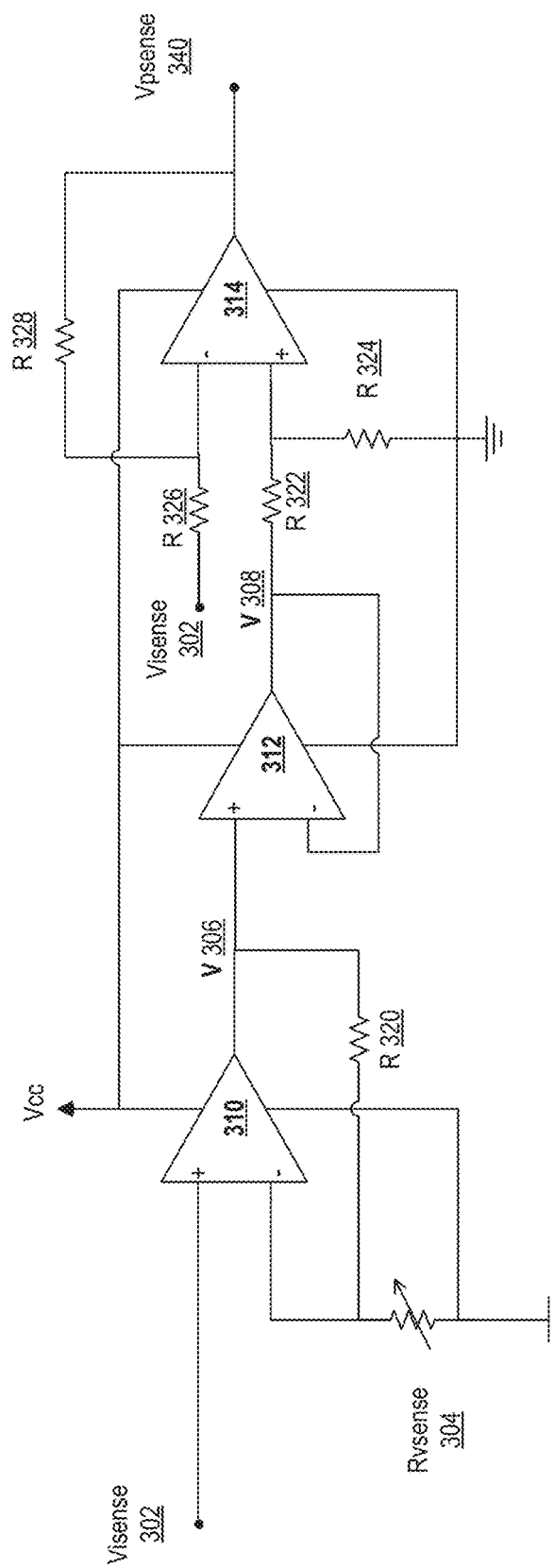
FIG. 3 is a diagram of a three stage circuit to generate a power sense output, according to one example.

In one example, the third stage circuit 106 can be used to generate the power sense output, for example, by subtracting the Visense 242 from the buffered output voltage of the second stage circuit 104. In the example of FIG. 3, an operational amplifier can be used. The power sense output can be provided to a controller engine 260. As noted, the third stage circuit 106 yields a power sense output based on a difference between the buffered output voltage and the Visense 242. In some examples, being based on a difference means subtracting the value of Visense 242 from the buffered output voltage. This can be true even if the third stage circuit additionally adds a scaling factor as further described in FIG. 3. As used herein, the power sense output is an analog representation of the power of the server based on the Visense 242 line and Vsense 244 line.

In one example, the controller engine 260 is part of a separate physical device than the server 210. For example, the controller engine 260 can be implemented on an enclosure 200 while the servers 210 are attached via one or multiple connectors. Locating the controller engine 260 on a separate enclosure 200 allows for managing multiple servers 210 at the same time.

The controller engine 260 can receive the power sense output. Moreover, the controller engine 260 can convert the power sense output to a digital value. Further, the controller engine 260 can determine a management action based on the digital value. In one example, the management action can be to log an event. In another example, the management action may include performing a power management action such as throttling a processor to lower power consumption of a server. In a further example, the management action can include controlling thermal parameters (e.g., the speed of one or more fans) based on the power consumption of one or multiple servers.

As noted herein, the controller engine 260 may be implemented via a processor, instructions, and/or other circuitry. For example, the controller engine 260 may include a multiplexor to receive power sense lines from each of the servers 210a-210n that are implemented in the computing system 100. An analog to digital converter can be included to convert the respective power sense lines to digital values. Because the power sense lines include information about current and voltage used in the respective servers, a separate reading for voltage and current is not needed. As such, a single sample (or set of samples) can be taken by the analog to digital converter. This can be more accurate than taking voltage samples of a power line at one time and current samples at a second time to utilize a single analog to digital converter.

A processor 230, such as a central processing unit (CPU) or a microprocessor suitable for retrieval and execution of instructions and/or electronic circuits can be configured to perform the functionality of various engines described herein. In certain scenarios, instructions and/or other information, can be included in memory 232 or other memory. In other examples, the servers are computing devices that can be used for high performance compute, mission critical processes, or other processing using a processor, memory, and other components (e.g., a graphics processor). An operating system and/or applications can be implemented on a CPU. In some examples, a management subsystem can be implemented to manage the enclosure 200 and/or servers 210.

The controller engine 260 can include hardware and/or combinations of hardware and programming to perform functions provided herein. Moreover, the modules (not shown) can include programming functions and/or combinations of programming functions to be executed by hardware as provided herein. When discussing the engines and modules, it is noted that functionality attributed to an engine can also be attributed to the corresponding module and vice versa. Moreover, functionality attributed to a particular module and/or engine may also be implemented using another module and/or engine.

FIG. 3 is a diagram of a three stage circuit to generate a power sense output, according to one example. The diagram includes three operation amplifiers 310, 312, 314. The operational amplifiers can be powered by a positive power supply Vcc and connected to a negative power supply (in this example ground).

A current sense voltage input Visense 203 can be used to feed into the positive terminal of a first stage operational amplifier 310. Similarly, a voltage sense line Vsense can be used as an input to a variable resistor Rvsense 304. As noted above, the Rvsense can have an inverse relationship to Vsense. Characteristics of the relationship can be known to a controller engine that monitors the power sense output. A known resistive value R 320 can be used to separate the inverting input of the first stage operational amplifier 310 from the output voltage V 306 of the first stage operational amplifier 210.

The second stage operational amplifier 312 can be used to buffer the output voltage 306 of the first stage operational amplifier 310. The second stage operational amplifier 312 can have an input of the output voltage 306 of the first stage operational amplifier on its non-inverting input and a feedback input that is the output voltage V 308 of the second stage operational amplifier 312.

V 308 and Visense 302 can be used as inputs to a circuit including third stage operational amplifier 314, which is set up as a difference amplifier. Resistors 322, 324, 326, and 328 can have known values to the controller engine using Vpsense 340. These resistance values can be within a certain tolerance. Further, the resistance values can be different or the same.

In one simple example for explanatory purposes, the resistance values of R 320, 322, 324, 326, 328 are the same. In one example, V 306=Visense 302+(R 320/RVsense 304)× Visense 302). The characteristics of RVsense 304 can be known to the controller engine. In one example, Rvsense is inversely proportional to the load voltage Vsense. In other words Rvsense=K/Vsense. Here, K is a known or characterized value to the controller engine. Also, V 308 can equal V 306.

In one example, operational amplifier 314 is placed in a difference circuit so that V 308−Visense 302. In this example, R 322, 324, 326, 328 can have the same resistance values. Differing values of resistance can be known and accounted for in an amplified difference amplifier mode.

In the example above, Vpsense 340=Visense 302+(R 320/RVsense 304)×Visense 302−Visense 302. As such, Vpsense 340=(R 320/Rvsense 304)×Visense 302. As noted above, the resistance values and characteristics of the variable resistor 304 can be known. In one example, Vpsense 340=(R 320×Vsense/K)×Visense 302. As such, the Vpsense 340 line can equal a scaling value time power. The characteristics of Vsense and Visense can be known to the controller engine. For example, Vsense and/or Visense may be scaled (e.g., 12V power sample=3V Vsense or 10 A=1.5 V Visense). The known characteristics can be used to program the controller engine to be able to determine a power level of the server based on Vpsense 340. For example, a lookup table or a function can be used to relate Vpsense 340 to a value.

Figure 4:
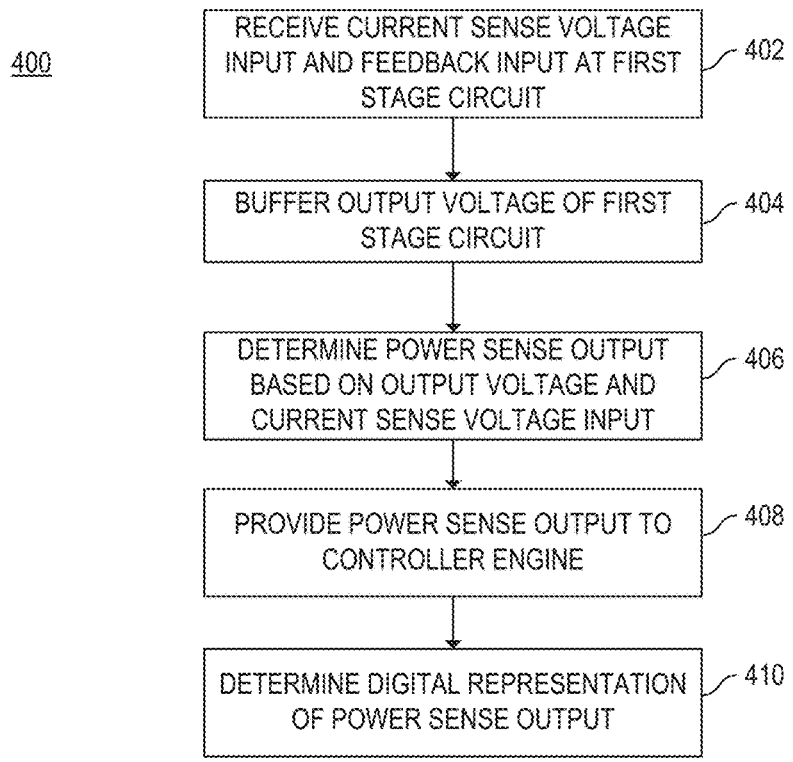
FIG. 4 is a flowchart of a method for providing a power sense output, according to an example.

FIG. 4 is a flowchart of a method for providing a power sense output, according to an example. Although execution of method 400 is described below with reference to computing system 100, other suitable components for execution of method 400 can be utilized. Additionally, the components for executing the method 400 may be spread among multiple devices. For example, circuits 102, 104, 106 can be on a server 210 that is a separate device from an enclosure 200. The server 210 can be connected to the enclosure 200. Moreover, the enclosure may include a controller engine 260 that performs a part of the method.

At 402, the first stage circuit 102 receives a current sense voltage input of the server and a feedback voltage input. The as shown in FIG. 3, the feedback voltage input can be based on a variable resistance value from a voltage controlled resistor. The voltage sense line can be used to control the voltage controlled resistor. Moreover, a known fixed resistance value can be used between the output of the first stage circuit and the feedback voltage input.

At 404, a second stage circuit 104 buffers the first output voltage to yield a second output voltage. In some examples, the voltages are the same (within a tolerance), however, including the buffer isolates the third stage circuit 106 from the first stage circuit 102.

At 406, the third stage circuit is to determine the power sense output based on the output voltage from the second stage and the current sense input. As noted above, the difference operational amplifier circuit can be used to subtract the current sense input from the output voltage. The result is a power sense output that represents the power usage of the server.

At 408, the power sense output is provided to a controller engine 260. In one example, the power sense output is connected via a connector on the server 210 to the controller engine 260 on the enclosure. In some examples, a multiplexor can be used to provide multiple power sense outputs from multiple servers 210 to the controller engine 260. In some examples, the controller engine 260 may include the multiplexor. At 410, the controller engine 260 can determine a digital representation of the power sense output.

Figure 5:
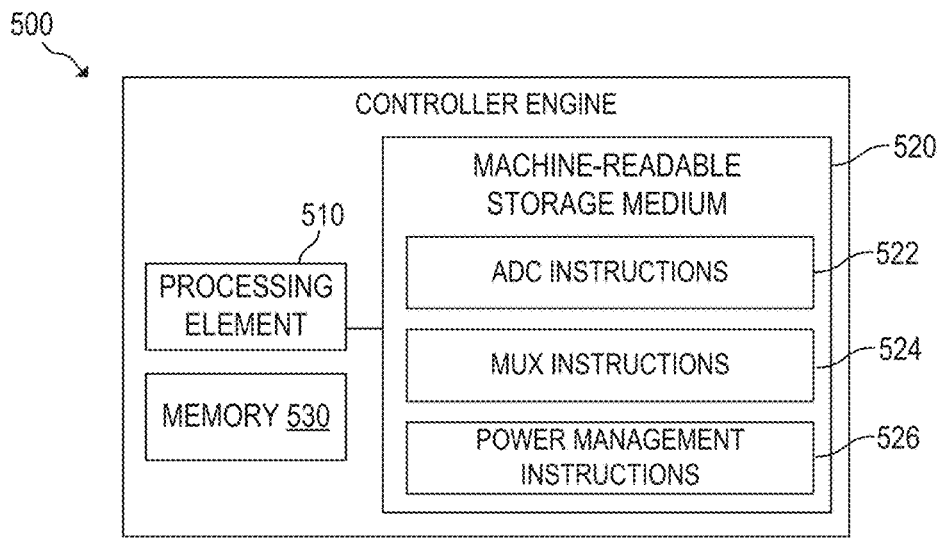
FIG. 5 is a block diagram of a controller engine capable of using a power sense output received from multiple servers, according to an example.

FIG. 5 is a block diagram of a controller engine capable of using a power sense output received from multiple servers, according to an example. The controller engine 500 includes, for example, a processing element 510, and a machine-readable storage medium 520 including instructions 522, 524, 526 for receiving an analog power sense line, converting the analog line to a digital value, and performing power management functionality based on the power sense line. Controller engine 500 may be, for example, a microcontroller or baseboard management controller located on an enclosure to receive power consumption input from one or multiple servers connected to the enclosure.

Processing element 510 may be, one or multiple processing units, one or multiple semiconductor-based microprocessor, one or multiple ASICs, other hardware devices suitable for retrieval and execution of instructions stored in machine-readable storage medium 520, or combinations thereof. The processing element 510 can be a physical device. Moreover, in one example, the processing element 510 may include multiple cores on a chip, include multiple cores across multiple chips, multiple cores across multiple devices, or combinations thereof. Processing element 510 may fetch, decode, and execute instructions 522, 524, 526 to process and use a power sense output voltage. As an alternative or in addition to retrieving and executing instructions, processing element 510 may include at least one integrated circuit (IC), other control logic, other electronic circuits, or combinations thereof that include a number of electronic components for performing the functionality of instructions 522, 524, 526.

Machine-readable storage medium 520 may be any electronic, magnetic, optical, or other physical storage device that contains or stores executable instructions. Thus, machine-readable storage medium may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium can be non-transitory. As described in detail herein, machine-readable storage medium 520 may be encoded with a series of executable instructions for to manage power for a computing system.

In one example, processing element 510 can execute multiplexor (MUX) instructions 524 to select one of one or multiple power sense output lines from servers coupled to an enclosure monitored by the controller engine 500. The selected power sense output is forwarded to an ADC associated with the controller engine 500. The ADC instructions 522 can be executed to control the ADC to sample the selected power sense output line. In certain examples, a multiplexor is not used and the ADC is directly coupled to the power sense output line. The ADC can generate a representation of the power of the server associated with the selected power sense line.

The controller engine 500 can be configured to execute power management instructions 526 to perform power management actions based on the representation. In one example, the controller engine 500 includes memory 530 that can include conversion information for the representation. In one example, the conversion information can be used to translate the representation to a power value. The conversion information can be based on the known resistance values of a circuit and/or a variable resistive value of a voltage controlled resistor as described herein. As noted above, the variable resistive value can be inversely proportional to a voltage sense line.

Power consumption within a data center may be managed following various strategies. The limits on power consumption within a data center may be referred to as power capping. Power capping strategies can concentrate on the power usage at the enclosure/chassis level for rack mounted servers, blade servers, and both one and multi-node enclosure blade or cartridge systems. A cap refers to a type of limit, such that a power cap is a limit on power and a power consumption cap is a limit on power consumption. In one example, a node refers to a group of one or more blade servers or cartridges within a blade system. In some examples, group capping may be performed. In some examples, this can be implemented as a signal sent to each of the servers and/or CPUs within the servers.

For example, a signal can be sent to a management subsystem in one or more of the servers. The management subsystem may send a signal (e.g., a pulse width modulation signal) to one or multiple CPU, GPU, or other component of the server to throttle the speed of the component, which in turn can control power used by the respective server. In some examples, the controller engine 500 can directly send the signal to a CPU, GPU, or other component that can be throttled.

In one example, a controller engine can include a baseboard management controller (BMC) can be used to perform the analysis to determine what events to store for root cause analysis of errors. BMCs provide so-called "lights-out" functionality for computing devices. The lights out functionality may allow a user, such as a systems administrator to perform management operations on the computing device even if an operating system is not installed or not functional on the computing device. Moreover, in one example, the BMC can run on auxiliary power, thus the computing device need not be powered on to an on state where control of the computing device is handed over to an operating system after boot. As examples, the BMC may so-called provide management and so-called "out-of-band" services, such as remote console access, remote reboot and power management functionality, access to system logs, and the like. As used herein, a BMC has management capabilities for subsystems of a computing device, and is separate from a processor that executes a main operating system of a computing device (e.g., a server or set of servers). The BMC may comprise an interface, such as a network interface, and/or serial interface that an administrator can use to remotely communicate with the BMC. In some examples, a BMC may be included as part of an enclosure. In other examples, a BMC may be included in one or more of the servers (e.g., as part of the management subsystem of the server).

While certain implementations have been shown and described above, various changes in form and details may be made. For example, some features that have been described in relation to one implementation and/or process can be related to other implementations. In other words, processes, features, components, and/or properties described in relation to one implementation can be useful in other implementations. Furthermore, it should be appreciated that the systems and methods described herein can include various combinations and/or sub-combinations of the components and/or features of the different implementations described. Thus, features described with reference to one or more implementations can be combined with other implementations described herein.

What is claimed is:

1. A computing system comprising:
   a first stage circuit with a first voltage input of a current sense line of a server and a first feedback voltage input based on a first output voltage of the first stage circuit and a variable resistance value based on a voltage sense line of the server;
   a second stage circuit to buffer the first output voltage to yield a second output voltage; and
   a third stage circuit that yields a power sense output based on a difference between the second output voltage and the first voltage input.

2. The computing system of claim 1, wherein the second stage circuit further comprises a second voltage input of the first output voltage and a second feedback voltage input based on a second output voltage of the second stage circuit.

3. The computing system of claim 2, wherein the first output voltage is further based on a known resistance value.

4. The computing system of claim 3, wherein the first output voltage equals the first voltage input plus the known resistance value times the first voltage input divided by the variable resistance value.

5. The computing system of claim 3, further comprising:
   a controller engine comprising a processing element and a non-transitory machine-readable storage medium including instructions that, when executed by the processing element, cause the controller engine to:
   receive the power sense output;
   convert the power sense output to a digital value; and
   determine a management action based on the digital value.

6. The computing system of claim 5, wherein the processing element is further to execute the instructions to cause the controller engine to base the management action based on a known scaling factor associated with the known resistance value and a characteristic of the variable resistance value.

7. The computing system of claim 6, further comprising:
   an enclosure including the controller engine; and
   the server coupled to the enclosure, wherein a connector connects the power sense output on the server to the enclosure.

8. The computing system of claim 4, wherein
   the first stage circuit includes a first operational amplifier;
   the second stage circuit includes a second operational amplifier; and
   the third stage circuit includes a third operational amplifier.

9. The computing system of claim 1, wherein the variable resistive value is derived from a voltage controlled resistor and wherein the variable resistive value is inversely proportional to the voltage sense line.

10. A computing system comprising:
    an enclosure; and
    a plurality of servers, wherein each server includes:
    a first stage circuit with a first voltage input of a current sense line of the respective server and a first feedback voltage input based on an first output voltage of the first stage circuit and a voltage controlled resistor based on a voltage sense line of the respective server;
    a second stage circuit to buffer the first output voltage to yield a second output voltage; and
    a third stage circuit that yields a power sense output based on a difference between the second output voltage and the first voltage input.

11. The computing system of claim 10, wherein the first output voltage is further based on a second resistor.

12. The computing system of claim 11, wherein the enclosure further comprises a controller engine, the controller engine to receive the respective power sense output and to perform an action for the respective server based on its respective power sense output.

13. The computing system of claim 12, wherein the first output voltage equals the first voltage input plus a first resistance value of the second resistor times the first voltage input divided by a second resistance value of the voltage controlled resistor.

14. The computing system of claim 13, wherein the second resistance value is inversely proportional to the voltage sense line.

15. The computing system of claim 13, wherein the controller engine is to base the management action based on a known scaling factor associated with the known resistance value and a characteristic of the variable resistance value.

16. A method comprising:
receiving, at a first stage circuit, a first voltage input of a current sense line of a server and a first feedback voltage input based on a first output voltage of the first stage circuit, a variable resistance value from a voltage controlled resistor controlled by a voltage sense line of the server, and a known resistance value of a resistor;
buffering, at a second stage circuit, the first output voltage to yield a second output voltage;
determining a power sense output based on a difference between the second output voltage and the first voltage input;
providing the power sense output to a controller engine; and
determining a digital representation of the power sense output by the controller engine.

17. The method of claim 16, wherein the first stage circuit, the second stage circuit, and the third stage circuit are on the server and the controller engine is disposed on an enclosure, wherein the enclosure is coupled to the server.

18. The method of claim 17, further comprising:
performing a management action based on a known scaling factor associated with the known resistance value and a characteristic of the variable resistance value.

19. The method of claim 18, wherein the variable resistive value is inversely proportional to the voltage sense line.

20. The method of claim 16, further comprising, multiplexing the power sense output and other power sense outputs to the controller engine.

* * * * *